(12) United States Patent
Lee

(10) Patent No.: US 6,281,825 B1
(45) Date of Patent: Aug. 28, 2001

(54) DIGITAL-TO-ANALOG CONVERTER

(75) Inventor: Kwang-Hee Lee, Kyuggi-do (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/534,955

(22) Filed: Mar. 24, 2000

(30) Foreign Application Priority Data

Mar. 25, 1999 (KR) .................................................. 99-10298

(51) Int. Cl.[7] .................................................. H03M 1/66
(52) U.S. Cl. .................................................. 341/144
(58) Field of Search .................................................. 341/144

(56) References Cited

U.S. PATENT DOCUMENTS

| | | | |
|---|---|---|---|
| 4,405,916 | * | 9/1983 | Hornak et al. .................. 341/144 |
| 4,583,076 | * | 4/1986 | Luschnig ........................ 341/144 |
| 5,760,725 | * | 6/1998 | Yoshida et al. .................. 341/144 |
| 6,072,415 | * | 6/2000 | Cheng ............................ 341/144 |

* cited by examiner

*Primary Examiner*—Trong Phan
(74) *Attorney, Agent, or Firm*—Skjerven Morrill MacPherson LLP; David W. Held

(57) ABSTRACT

A digital-to-analog converter employs current drive circuits connected to an output voltage terminal. At least one of the current drive circuits includes a current division circuit that splits current from a first power source into a plurality of current paths in response to at least a first bias voltage. A current dissipation circuit is between one of the paths and a second power supply source, and a current switching circuit selectably connects another of the paths to the voltage terminal, which is connected to the second power source through a voltage establishing device. The switching circuit responds to one of the digital bits.

8 Claims, 7 Drawing Sheets

US 6,281,825 B1

DIGITAL-TO-ANALOG CONVERTER

FIELD OF THE INVENTION

The present invention is in the field of digital-to-analog converters and is more specifically related to a digital-to-analog converter establishing an output voltage by adjusting current.

BACKGROUND OF THE INVENTION

Many electronic circuits use digital-to-analog converters (DACs) for converting digital signals to corresponding analog signals. For example, cellular base stations, wireless communication systems, direct digital frequency synthesizers, signal reconstruction circuits, test equipment, high resolution imaging systems, and arbitrary waveform generators often require high resolution, high speed DACs.

A DAC (or ADC) is an important component for processing video signals and displaying still and sub pictures in imaging systems such as televisions, video tape recorders, digital cameras, and various multi-media apparatuses. More particularly, digitized video signals are common in interpolating, compressing, expanding, and displaying images in multi-media technology such as with computer systems, as well as in the televisions and digital cameras, and such digitized video signals often need to be converted to analog form after digital processing. Accordingly, enhancing the resolution of digital-to-analog converters in the video and multi-media imaging systems is desirable.

FIG. 1 shows the construction of a DAC system having buffer circuits 10 and 40, a decoder 20, a delay circuit 30, a bias voltage supply circuit 50, and a DAC core circuit 60. The buffer circuit 10, which includes two buffers 11 and 12, receives digital signals (bits) D1 through D10. The decoder 20 receives the four most significant bits D7 through D10 and generates a 15-bit digital signal having between zero and fifteen bits in a logic low state, depending on the value represented by the 4-bit input signal to decoder 30. The delay circuit 30 delays the 6-bit digital signal from the buffer 12 of the buffer circuit 10 and applies a delayed 6-bit digital signal to buffer 42 of the buffer circuit 40 when decoder 20 applies the 15-bit signal to buffer 41 of buffer circuit 40. DAC core circuit 60 receives the 15-bit and 6-bit digital signals from the buffer circuit 40 at the same time. The bias voltage supply circuit 50 generates bias voltages VBa and VBb to control the DAC core circuit 60 for generation of an appropriate output voltage Vdac for a display apparatus such as electron gun 70.

The DAC core circuit 60, as shown in FIG. 2, has twenty-one current drive circuits CURI through CUR21, each assigned to a corresponding one of the twenty-one digital signals (15 bits+6 bits). The bias voltages VBa and VBb and the digital signals D1 ' through D21' (and their complements D1B' through D21 B') control currents I1 through I21 that the current drive circuits conduct to an output summing node N1 at which output voltage Vdac is generated. When activated each of current drive circuits CUR2 to CUR6 provides about twice the current of the preceding one of circuits CUR1 to CUR5. Current drive circuits CUR7 to CUR21 all provide about the same current when respective digital signals D1' to D21' are in the logic low state. Output voltage Vdac results from a total current Isum flowing from the node N1 to a substrate voltage VSS through a resistor R.

FIG. 3 illustrates a situation where the output voltage Vdac from the DAC core circuit 60 is intended to match the shape of an analog wave. Unfortunately, when the output voltage Vdac is near a maximum voltage Vmax, drain-to-source voltages of PMOS transistors PM1 and PM2 in current drive circuits CUR1 and CUR2 are less than when output voltage is near a minimum voltage Vmin. Accordingly, currents I1 and I2 that respectively flow through current drive circuits CUR1 and CUR2 to the node N1 decrease as shown with curve C of FIG. 4 because variation in the output voltage Vdac at the node N1 affects the drain-to-source voltages of PMOS transistors PM1 and PM2. For example, current I2 from current drive circuit CUR1 is ideally one quarter (¼) of a current I that flows into the common source node of transistors PM1 and PM1', and current I4 from current drive circuit CUR2 is ideally one half (½) of the current I that flows in the common source node of transistors PM2 and PM2'. Correspondingly, as shown in the curve D, currents I1' (ideally ¾ of current I) and I2' (ideally ½ of current I), which flow to reference voltage VSS through respective PMOS transistors PM1' and PM2', increase as output voltage Vdac increases. The drain-to-source current Ids (of PMOS transistors PM1 and PM2) declines, as shown with curve E of FIG. 5 (curve F is an ideal form), in the saturation region so that the drain-to-source current is influenced by a λ-effect (i.e., channel length modulation effect) induced from node N1. Such a decline of the current, as shown in FIG. 3, lowers levels of output voltage Vdac to levels B, which are lower than the desired levels A when output voltage Vdac is near maximum voltage Vmax. This can degrade the resolution of a display apparatus using the analog output voltage from the DAC.

SUMMARY OF THE INVENTION

A digital-to-analog converter in accordance with an embodiment of the invention employs a plurality of current drive circuits connected to an output voltage terminal. At least one of the current drive circuits includes: a current division circuit that splits a current from a first power source (e.g., a supply voltage terminal) among a plurality of current paths in response to at least one bias voltage; a current dissipation circuit connected between one of the current paths and a second power source (e.g., a reference voltage terminal); and a current switching circuit for selectably connecting another of the current paths to the voltage terminal. A voltage establishing device connects to the output voltage terminal. The switching circuit transfers a shared current to the voltage terminal in response to corresponding one of the digital bits. The current division circuit can determine the magnitude of the current output to the output voltage terminal, while the current switching circuit determines whether the current drive circuit outputs the current to the voltage output terminal. The current switching circuit also shields the current division circuit from the effects of high output voltage so that the current remains constant and accurate even when the output voltage approaches its maximum.

BRIEF DESCRIPTION OF THE DRAWINGS

For a better understanding of the invention, and to show how embodiments of the same may be carried into effect, reference will now be made, by way of example, to the accompanying diagrammatic drawings, in which.

In the figures, like reference numerals denote like or corresponding parts.

DETAILED DESCRIPTION OF THE PREFERRED EMBODIMENTS

Figure 1:
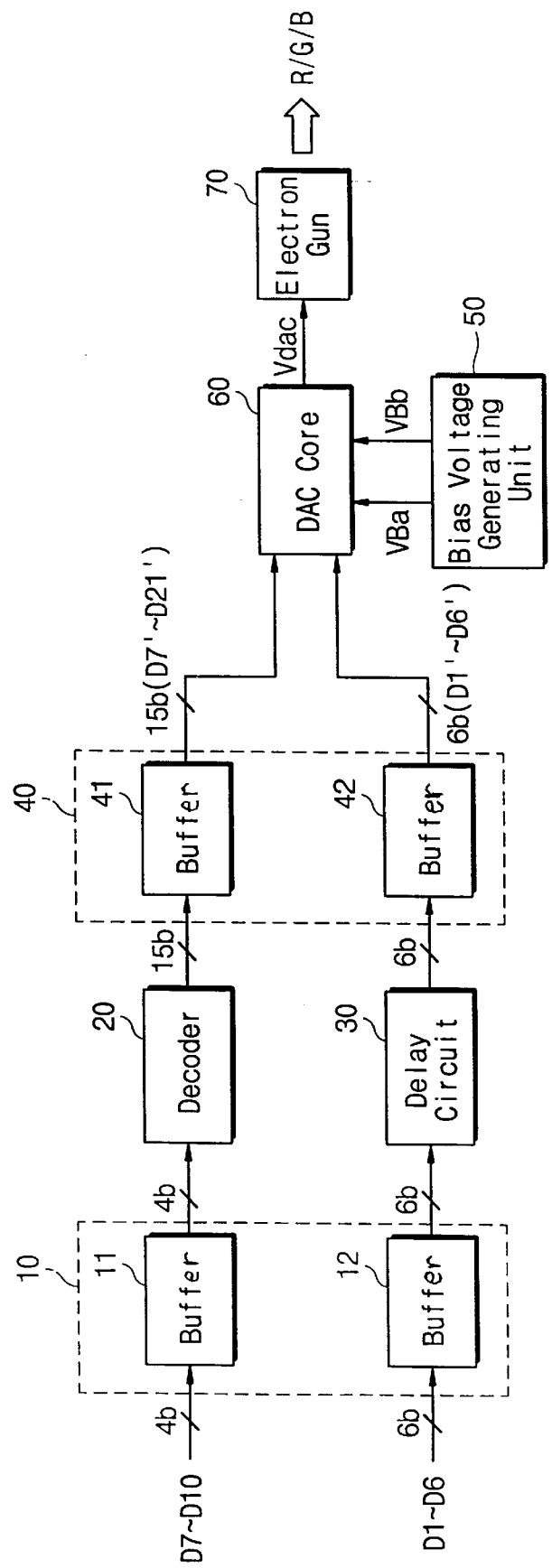
FIG. 1 is a block diagram of a digital-to-analog converter.
Figure 6:
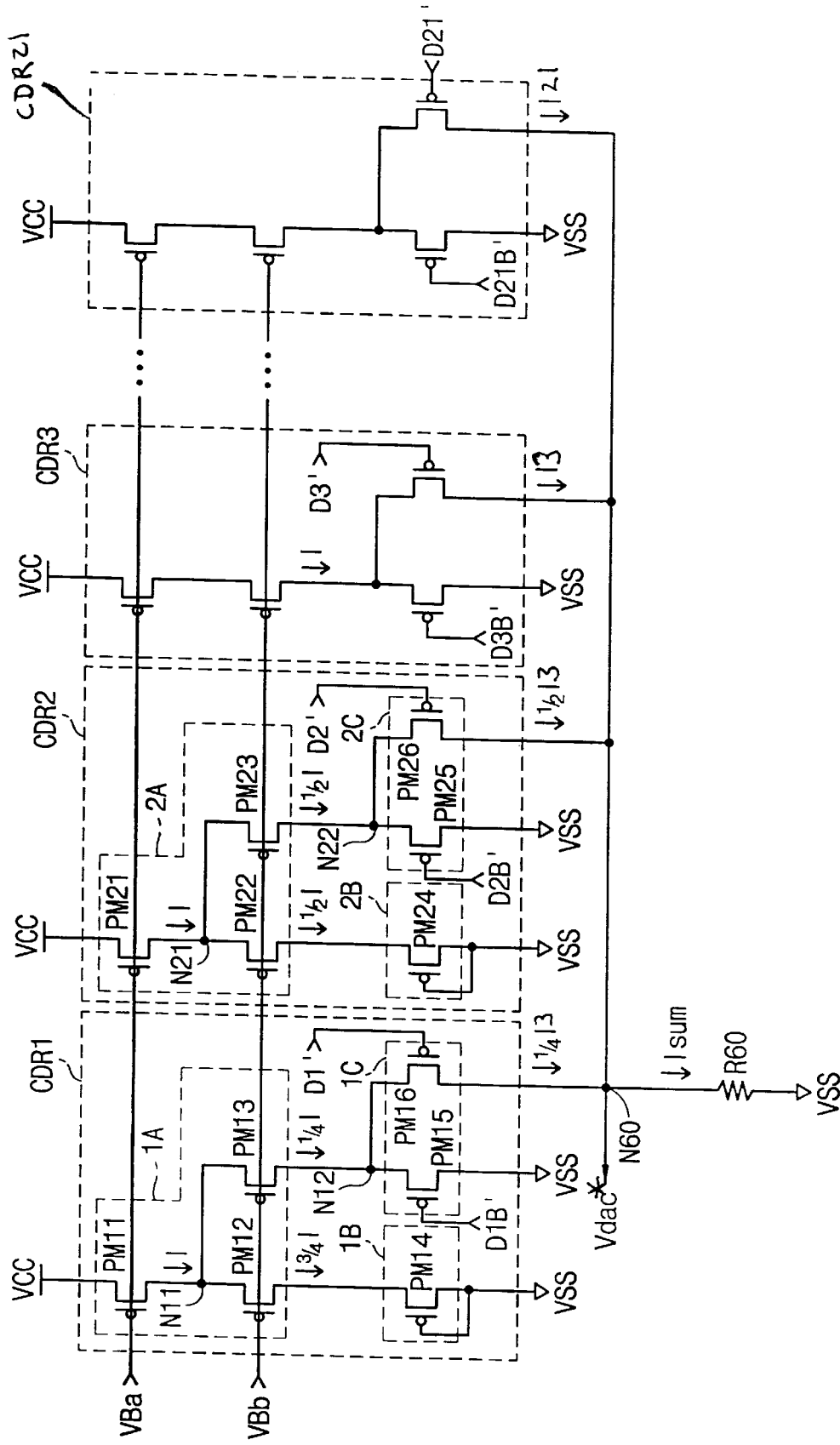
FIG. 6 is a circuit diagram of a core circuit employed in a digital-to-analog converter in accordance with an embodiment of the invention.

FIG. 6 shows an embodiment of a DAC core circuit according to the invention. The DAC core circuit of FIG. 6 may be used as DAC core 60 in the arrangement of the digital-to-analog converter of FIG. 1. Referring to FIG. 6, twenty-one current drive circuits CDR1 through CDR21 are connected in parallel between the power supply voltage Vcc and output voltage terminal N60. A resistor R60 connects output voltage terminal N60 to a reference (or ground) voltage VSS. Current drive circuits CDR1 through CDR6 respectively receive digital signals D1' through D6' from buffer 41, and current drive circuits CDR7 through CDR21 respectively receive digital signals D7' through D21' from buffer 42.

Figure 2:
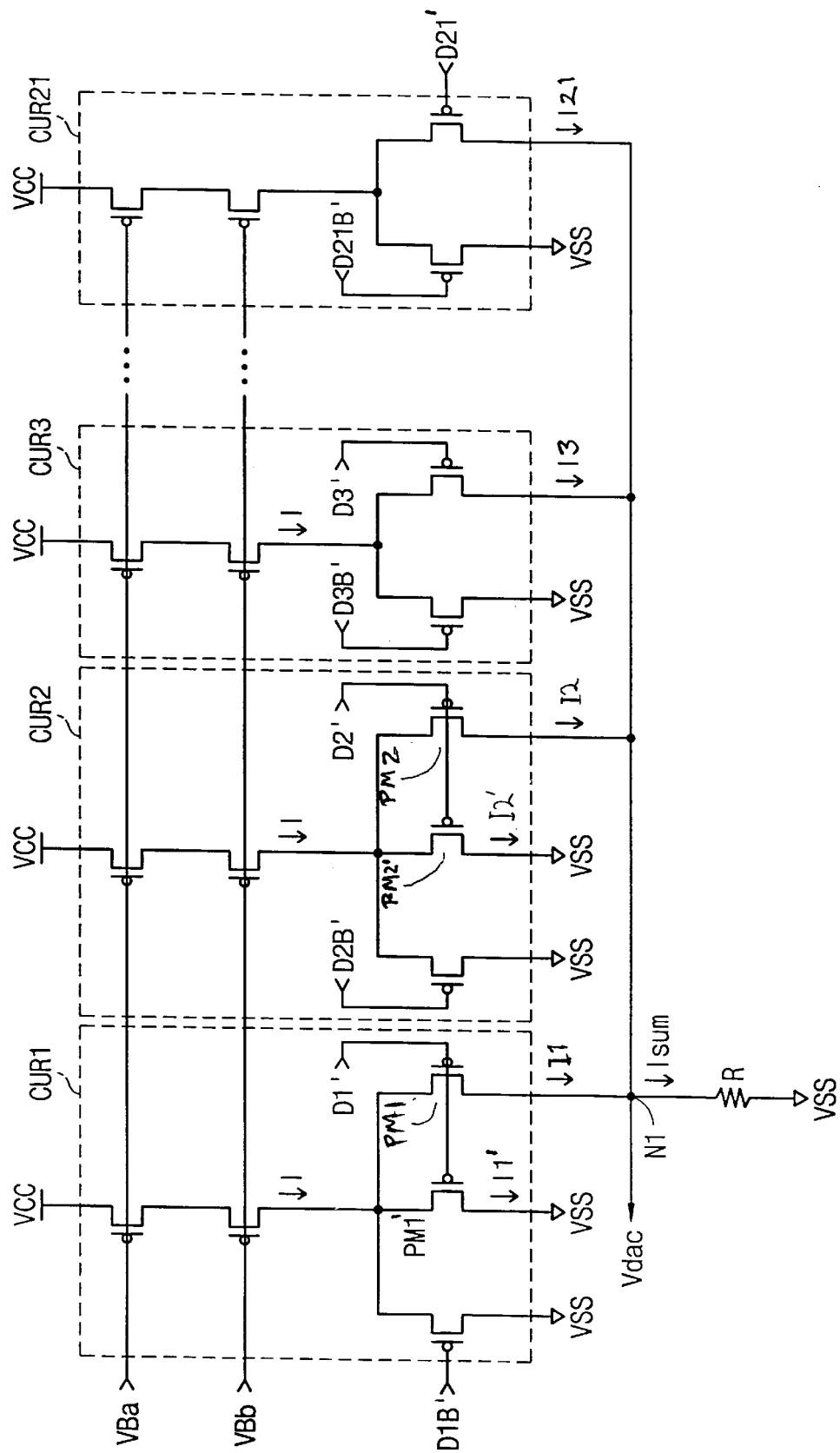
FIG. 2 shows a circuit diagram of a core circuit in the converter of FIG. 1.

Current drive circuits CDR1 and CDR2, which provide the smallest currents, differ in construction from the current drive circuits CDR3 through CDR21, even when the sizes of transistors are ignored. Alternative embodiments of the invention further employ the principles and construction of the current drive circuits CDR1 and CDR2 in one or more of current drive circuits CDR3 to CDR21. The current drive circuits CDR1 and CDR2, also differ from the current drive circuits CUR1 and CUR2 (FIG. 2) and as a result improve the accuracy and resolution of output voltage Vdac*. More particularly, current drive circuits CDR1 and CDR2 maintain a more constant output current to avoid non-linearity in the digital-to-analog conversion and provide an output voltage that can more nearly match an original analog waveform. The other current drive circuits CDR3 through CDR21 operate within a narrower range of output voltage Vdac* and are therefore less affected by changes in the output voltage Vdac*. Accordingly, current drive circuits CDR3 through CDR21 can use the same construction as corresponding current drive circuits CUR3 to CUR21 of FIG. 2.

The current drive circuits CDR1 and CDR2 are substantially the same but have transistors sized differently so that current drive circuit CDR1 has half the output current of current drive circuit CDR2. The current drive circuit CDR1 (or CDR2) includes a current division part 1A (or 2A), a discharging part 1B (or 2B), and a switching part 1C (or 2C). The division part 1A includes: a PMOS transistor PM1 connected between supply voltage Vcc and a node N11; a PMOS transistor PM12 having source connected to the node N11, and a PMOS transistor PM13 connected between the node N11 and a node N12. The gates of transistors PM11 and PM12 receive the respective bias voltages VBa and VBb from the bias voltage supply circuit 50 of FIG. 1. The gate of transistor PM13 also receives the bias voltage VBb. The discharging part 1B includes a PMOS transistor PM14 connected between the drain of PMOS transistor PM12 and ground voltage VSS, and the gate of PMOS transistor PM14 is also connected to ground voltage VSS. The switching part 1C includes: a PMOS transistor PM15 connected between the node N12 and ground voltage VSS; and a PMOS transistor PM16 connected between the node N12 and the output voltage terminal N60. The gate of PMOS transistor PM16 receives digital signal D1' while the gate of PMOS transistor PM15 receives digital signal D1B', which is the complement of signal D1'.

In the same manner, in current drive circuit CDR2, a division part 2A includes a PMOS transistor PM21 connected between supply voltage Vcc and a node N21, a PMOS transistor PM22 having a source connected to node N21, and a PMOS transistor PM23 connected between nodes N21 and N22. The gates of transistors PM21 and PM22 are respectively coupled to bias voltages VBa and VBb from bias voltage supply circuit 50 of FIG. 1. The discharging part 2B is a diode-connected PMOS transistor PM24 connected between the drain of PMOS transistor PM12 and ground voltage VSS to which the gate of PMOS transistor PM24 also connects. The switching part 2C includes a PMOS transistor PM25 connected between node N22 and ground voltage VSS, and a PMOS transistor PM26 connected between node N22 and output voltage terminal N60. The gate of transistor PM26 receives digital signal D2', and the gate of transistor PM25 receives digital signal D2B', which is the complement of signal D2'.

In current drive circuit CDR1, which corresponds to the least significant bit D1' and provides the finest current adjusting factor for a high resolution, the current division ratio between PMOS transistors PM12 and PM13 is 3:1, so that three quarters (¾) of the current I that flows into node N11 passes through PMOS transistor PM12 and one quarter (¼) of the current I passes through PMOS transistor PM13. In current drive circuit CDR2, which corresponds to the second least significant bit D2'and provides the secondly finest current adjusting factor for a high resolution, the current division ratio between PMOS transistors PM22 and PM23 is 1:1, so that one half (½) of the current I passes through PMOS transistor PM22 and the other half (½) of the current I passes through PMOS transistor PM23. The current passing through PMOS transistor PM12 of current drive circuit CDR1 passes through diode-connected PMOS transistor PM14 of discharging part 1B and dissipates into ground voltage VSS. Similarly, the current passing through PMOS transistor PM22 of current drive circuit CDR2 passes through diode-connected PMOS transistor PM24 and dissipates into ground voltage VSS. On the other hand, the current passing through PMOS transistor PM13 flows into terminal N60 through switching transistor PM16, which is on when the digital signal D1' is at the logic low voltage level, and the current passing through PMOS transistor PM23 flows into terminal N60 through switching transistor PM26, which is on when the digital signal D2' is at the logic low level.

Figure 7:
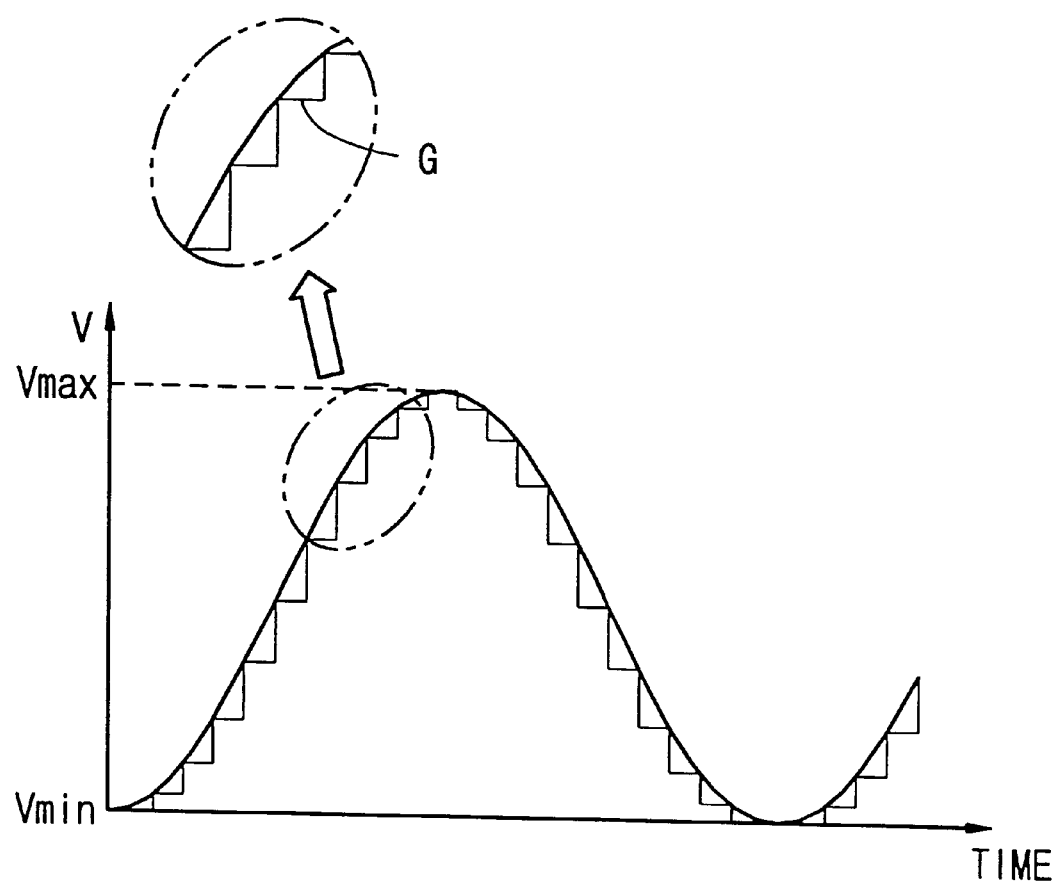
FIG. 7 shows an output voltage generated from the core circuit of FIG. 5 to generate an analog waveform.

Referring to FIG. 7, with the lapse of time, the output voltage Vdac* rises from a minimum voltage level Vmin to the maximum voltage level Vmax. When all of the digital signals D1' to D21' are activate (i.e., in the logic low voltage state), the output voltage Vdac* is at the maximum voltage Vmax. In this case, the total current Isum flowing from the output terminal N60 to ground voltage VSS through the resistor R60 is 255×I+(½)I+(¼)I, where 255×I is the summation of the currents flowing out of CDR3 through CDR21 for data signals D3' to D21' resulting from input data bits D3 to D10, and (½)I and (¼)I are the currents out of current drive circuits CDR2 and CDR1 corresponding to data bits D1 and D2. The output voltage Vmax is the product Isum×

R, where R is the resistance or the resistor R60. The output voltage Vdac* moves from voltage Vmax toward voltage Vmin, as the digital signals D1' to D21 are deactivated to high levels. Such rising and falling of output voltage Vdac* is repeatedly performed to generate the oscillation of an analog wave such as shown in FIG. 7.

Figure 3:
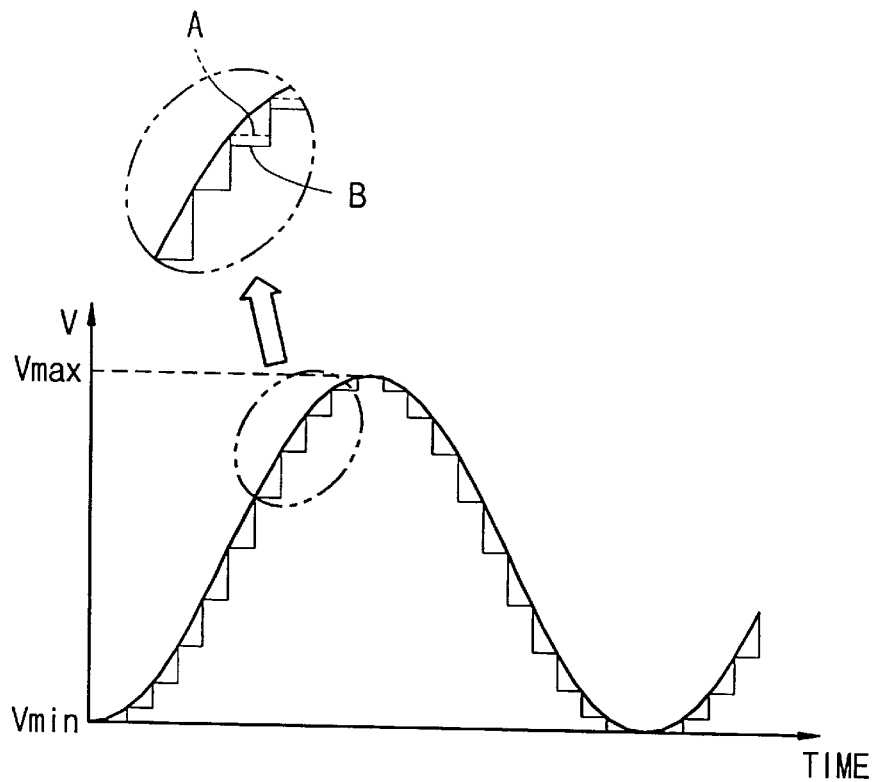
FIG. 3 shows an output voltage generated from the core circuit of FIG. 2 to generate an analog waveform.
Figure 5:
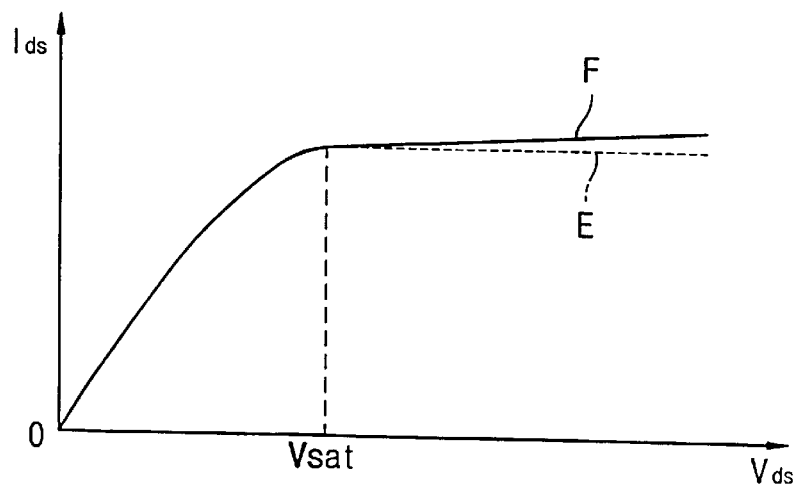
FIG. 5 shows the current-voltage characteristics of a MOS transistor.
Figure 4:
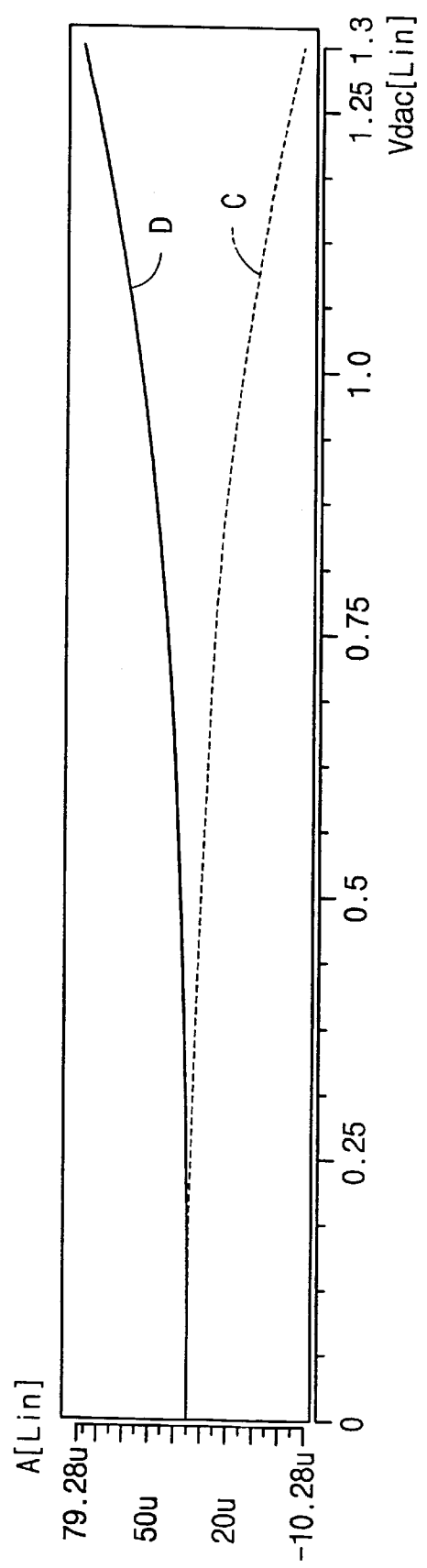
FIG. 4 shows plots of the current through different transistors in a current supply circuit of FIG. 2.

When output voltage Vdac* is near the maximum voltage Vmax, the high level of output voltage Vdac* does not significantly affect the drain-to-source voltage of the PMOS transistor PM13 even though the high output voltage Vdac* reduces the drain-to-source voltage of the PMOS transistor PM16. Accordingly, the amount of the current supplied into the source of PMOS transistor PM16 remains constant (¼ of I). Hence, PMOS transistor PM16 can be large enough to transfer the predetermined and constant amount of current (¼ I) to the terminal N60. Similarly, in current drive circuit CDR2, the currently high output voltage Vdac* does not significantly affect the drain-to-source voltage of PMOS transistor PM23 even though the high output voltage Vdac* reduces the drain-to-source voltage of PMOS transistor PM26. Accordingly, the amount of the current supplied into and transferred through PMOS transistor PM26 remains ½ of I. As shown in FIG. 7, the stepped (or digitized) levels of output voltage Vdac* accord with the corresponding values of the analog wave without the shortfall shown in FIG. 3 near maximum voltage Vmax.

Figure 8A:
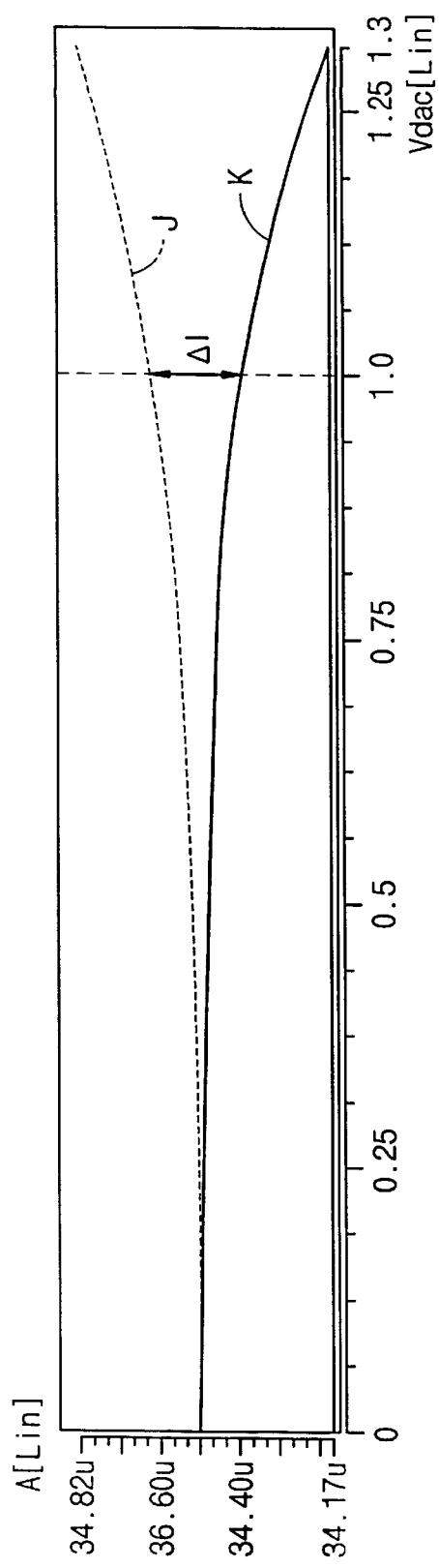
FIG. 8A shows current from a current drive circuit of FIG. 6 as a function of the output voltage of the core circuit.
Figure 8B:
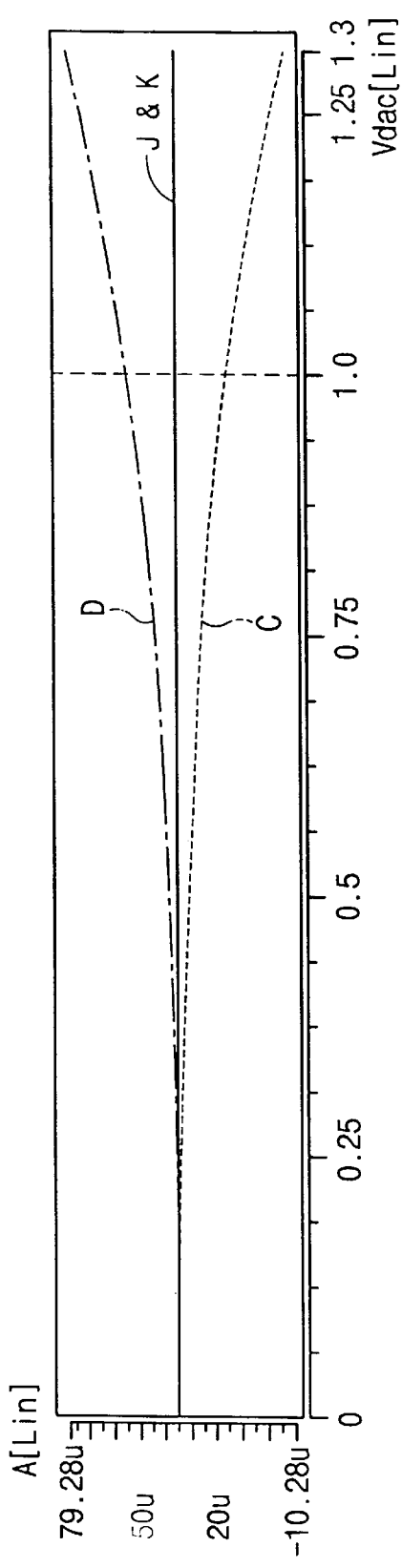
FIG. 8B shows a comparison between current in the circuit core of FIG. 2 and the circuit core of FIG. 6.

FIG. 8A shows the results of simulating with the currents flowing through the current drive circuit CDR1. As shown by plot J, the current passing through PM12 and PM14 increases logarithmically, while the current passing through transistors PM13 and PM16 decreases as shown by curve K. Considering that a typical DAC has a maximum voltage Vmax of about 1 V, the difference between the currents of plots J and K is under about 1 microampere at the maximum output voltage. As shown in FIG. 8B, this difference is insignificant when compared to current drop arising with the circuit of FIG. 2.

As described above, the present invention offers significant advantages over conventional DACs in that the linearity of the output voltage is improved by maintaining a more constant current. Accordingly, the output voltage of the DAC core circuit better matches the desired analog signals, particularly around the maximum voltage level. Therefore, the output voltage of the DAC core circuit of the invention can contribute to enhancing resolution of a display apparatus.

While this invention has been described in connection with what is presently considered to be the most practical and preferred embodiment, the invention is not limited to the disclosed embodiment, but, on the contrary, is intended to cover various modifications and equivalent arrangements included within the scope of the invention.

What is claimed is:

1. A digital-to-analog converter employing a plurality of current drive circuits that connect to a voltage terminal, wherein at least one of the current drive circuits comprises:
    a current division circuit that splits a current from a first power source into a plurality of current paths in response to at least a first bias voltage;
    a current dissipation circuit connected between one of the current paths and a second power source; and
    a current switching circuit that connects another one of the current paths to the voltage terminal which is connected to a voltage establishing device, the switching circuit responding to one of the digital bits.

2. The digital-to-analog converter of claim 1, wherein the current division circuit comprises:
    a first transistor between the first power source and the current dissipation device; and
    a second transistor between the first power source and the current switching circuit, wherein
    gates of the first and second transistor receive the first bias voltage.

3. The digital-to-analog converter of claim 2, wherein the current switching circuit comprises:
    a third transistor between the second transistor and the voltage terminal, the third transistor having a gate that receives a first binary signal; and
    a fourth transistor between the second transistor and the second power source, the fourth transistor having a gate that receives a second binary signal, wherein the second binary signal turns on the fourth transistor when the first binary signal turns off the third transistor.

4. The digital-to-analog converter of claim 1, wherein the first power source is a supply voltage terminal and the second power source is a ground voltage terminal.

5. A digital-to-analog converter comprising:
    a bias voltage supply circuit for generating at least a first bias voltage;
    a core circuit including a plurality of current drive circuits and receiving the bias voltage and a plurality of digital bits;
    a voltage terminal coupled to the current drive circuits in common; and
    a voltage establishing device coupled to the voltage terminal, wherein
    one of the current drive circuits comprises:
        a division part that splits a current from a first power source into a plurality of current paths in response to at least the first bias voltage;
        a dissipation part connected between one of the current paths and a second power source; and
        a switching part that selectably connects another of the current paths to the voltage terminal, the switching part responding to a bit.

6. The digital-to-analog converter of claim 5, wherein the current division circuit comprises:
    a first transistor between the first power source and the current dissipation device; and
    a second transistor coupled between the first power source and the current switching circuit, wherein
    gates of the first and second transistor receive the first bias voltage.

7. The digital-to-analog converter of claim 6, wherein the current switching circuit comprises:
    a third transistor coupled between the second transistor and the voltage terminal, the third transistor having a gate that receives a first binary signal; and
    a fourth transistor coupled between the second transistor and the second power source, the fourth transistor having a gate that receives a second binary signal, wherein the second binary signal turns on the transistor when the first binary signal turns off the third transistor.

8. The digital-to-analog converter of claim 5, wherein the first power source is a supply voltage terminal and the second power source is a ground voltage terminal.

* * * * *